United States Patent
Shim

(10) Patent No.: US 9,853,041 B2
(45) Date of Patent: Dec. 26, 2017

(54) SEMICONDUCTOR DEVICE AND METHODS OF MANUFACTURING AND OPERATING THE SAME

(71) Applicant: SK hynix Inc., Gyeonggi-do (KR)

(72) Inventor: Keon Soo Shim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/701,189

(22) Filed: Apr. 30, 2015

(65) Prior Publication Data

US 2015/0236036 A1    Aug. 20, 2015

Related U.S. Application Data

(62) Division of application No. 14/198,064, filed on Mar. 5, 2014, now Pat. No. 9,053,796.

(30) Foreign Application Priority Data

Oct. 24, 2013 (KR) .................. 10-2013-0127171

(51) Int. Cl.
```
G11C 16/04        (2006.01)
H01L 27/11573     (2017.01)
H01L 27/11582     (2017.01)
G11C 16/12        (2006.01)
```

(52) U.S. Cl.
CPC ........ *H01L 27/11573* (2013.01); *G11C 16/04* (2013.01); *G11C 16/12* (2013.01); *H01L 27/11582* (2013.01)

(58) Field of Classification Search
CPC ........................ H01L 27/11582; G11C 16/04

USPC ...................... 257/324; 365/185.17
See application file for complete search history.

(56) References Cited

U.S. PATENT DOCUMENTS

| | | | | |
|---|---|---|---|---|
| 6,353,242 B1 * | 3/2002 | Watanabe | .......... | G11C 16/0483 257/208 |
| 7,470,948 B2 * | 12/2008 | Park | ...................... | H01L 27/115 257/314 |
| 7,881,114 B2 * | 2/2011 | Park | ................... | G11C 16/0483 365/185.02 |
| 8,018,782 B2 * | 9/2011 | Park | ................... | G11C 16/0483 365/185.02 |
| 8,169,827 B2 * | 5/2012 | Guzzi | ............... | G11C 16/0483 365/185.17 |
| 8,502,295 B2 * | 8/2013 | Kim | ................. | H01L 27/11521 257/288 |
| 8,879,318 B2 * | 11/2014 | Ahn | ................... | G11C 16/0483 365/185.03 |
| 8,916,926 B2 * | 12/2014 | Choe | ................... | H01L 27/1157 257/324 |

(Continued)

*Primary Examiner* — Son Mai
(74) *Attorney, Agent, or Firm* — IP & T Group LLP

(57) ABSTRACT

A semiconductor device includes a memory cell array including a vertical channel layer, two or more selection transistors, and a plurality of memory cells formed along the vertical channel; a peripheral circuit suitable for programming the two or more selection transistors and the memory cells; and a control circuit suitable for controlling the peripheral circuit to decrease a pass voltage applied to one word line adjacent to two or more selection lines coupled to the respective selection transistors, during a program operation in which the peripheral circuit applies a program voltage to the two or more selection lines and applies the pass voltage to a plurality of word lines connected to the memory cells.

7 Claims, 5 Drawing Sheets

(56) References Cited

U.S. PATENT DOCUMENTS

| | | | | |
|---|---|---|---|---|
| 8,964,473 | B2* | 2/2015 | Dong | H01L 27/11519 |
| | | | | 365/185.05 |
| 9,111,617 | B2* | 8/2015 | Shim | G11C 16/0466 |
| 9,123,425 | B2* | 9/2015 | Dong | H01L 27/11519 |
| 9,305,648 | B2* | 4/2016 | Nguyen | G11C 16/10 |
| 2006/0050559 | A1* | 3/2006 | Sakui | H01L 27/115 |
| | | | | 365/185.17 |
| 2008/0261387 | A1* | 10/2008 | Ipposhi | H01L 21/84 |
| | | | | 438/533 |
| 2012/0086057 | A1* | 4/2012 | Kim | H01L 27/11521 |
| | | | | 257/288 |
| 2012/0140562 | A1* | 6/2012 | Choe | H01L 27/1157 |
| | | | | 365/185.18 |
| 2013/0161731 | A1* | 6/2013 | Bin | H01L 29/78 |
| | | | | 257/329 |
| 2014/0063935 | A1* | 3/2014 | Park | H01L 27/1158 |
| | | | | 365/184 |

* cited by examiner

SEMICONDUCTOR DEVICE AND METHODS OF MANUFACTURING AND OPERATING THE SAME

CROSS-REFERENCE TO RELATED APPLICATION

This application is a division of U.S. patent application Ser. No. 14/198,064 filed on Mar. 5, 2014, which claims priority to Korean patent application number 10-2013-0127171 filed on Oct. 24, 2013, in the Korean Intellectual Property Office. The entire disclosure of the foregoing application is incorporated by reference herein.

BACKGROUND

1. Technical Field

Various embodiments of the present invention relate to a semiconductor device technology, and more specifically, to a three-dimensional (3D) semiconductor device and methods of manufacturing and operating the same.

2. Related Art

Due to limitations in integration, a two-dimensional semiconductor device has been substituted by a 3D semiconductor device. The two-dimensional semiconductor device has a structure in which memory cells are arranged in a horizontal direction along a semiconductor substrate. On the other hand, in the 3D semiconductor device, memory cells are stacked in a direction perpendicular to a semiconductor substrate.

Each of the memory cells of the 3D semiconductor device may include either a floating structure or a Silicon-Oxide-Nitride-Oxide-Silicon (SONOS) structure. The SONOS structure is more general, and when the SONOS structure is applied, a drain selection transistor is connected between a bit line and a memory cell group, and a source selection transistor is connected between a source line and the memory cell group.

In the 3D semiconductor device, since the drain and source selection transistors have the same structure as the memory cells, the drain and source selection transistors have threshold voltages increased by a certain level to perform a function as a switching element after forming stack layers for the drain and source selection transistors.

Since the drain selection transistor performs a function of transferring a voltage transmitted from a bit line to a cell string, or electrically cutting the cell string off the bit line, a leakage current should not be generated from the drain selection transistor. To this end, two or more drain selection transistors coupled in series may be formed.

In such case, since gates of the two or more drain selection transistors are connected to the same drain selection line, the same voltage is applied to the gates of the two or more drain selection transistors. In this structure, due to a junction overlap between the drain selection transistors formed on an upper portion and a lower portion, an effective channel length in the drain selection transistor formed on the upper portion may be reduced. As a result, a leakage current in the drain selection transistor formed on the upper portion may be larger than that in the drain selection transistor formed on the lower portion. When the leakage current becomes large, reliability of a semiconductor device may be degraded since program disturbance characteristics in a program operation may be deteriorated.

SUMMARY

Various embodiments of the present invention are directed to a semiconductor device that may reduce a leakage current of a semiconductor device, and methods of manufacturing and operating the same.

One aspect of the present invention provides a semiconductor device including a memory cell array including a vertical channel layer, two or more selection transistors and a plurality of memory cells formed along the vertical channel, a peripheral circuit suitable for programming the two or more selection transistors and the memory cells, and a control circuit suitable for controlling the peripheral circuit to decrease a pass voltage applied to one word line adjacent to two or more selection lines coupled to the respective selection transistors, during a program operation in which the peripheral circuit applies a program voltage to the two or more selection lines and applies the pass voltage to a plurality of word lines connected to the memory cells.

Another aspect of the present invention provides a method of operating a semiconductor device with a plurality memory cells and two or more selection transistors formed along a vertical channel, including applying a pass voltage to selection lines connected to the two or more selection transistors and a plurality word lines connected to the memory cells to program the two or more selection transistors, applying a program voltage to the two or more selection lines, lowering the pass voltage applied to a word line adjacent to the selection lines among the word lines when applying the program voltage to the two or more selection lines, and discharging the two or more election lines and the word lines.

Another aspect of the present invention provides a method of manufacturing a semiconductor device including forming a vertical channel layer on a semiconductor substrate, forming word lines spaced apart from each other along the vertical channel layer, and forming two or more selection lines spaced apart from the word lines on the word lines, wherein one selection line adjacent to the word lines among the selection lines has a larger resistance than the other selection lines.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
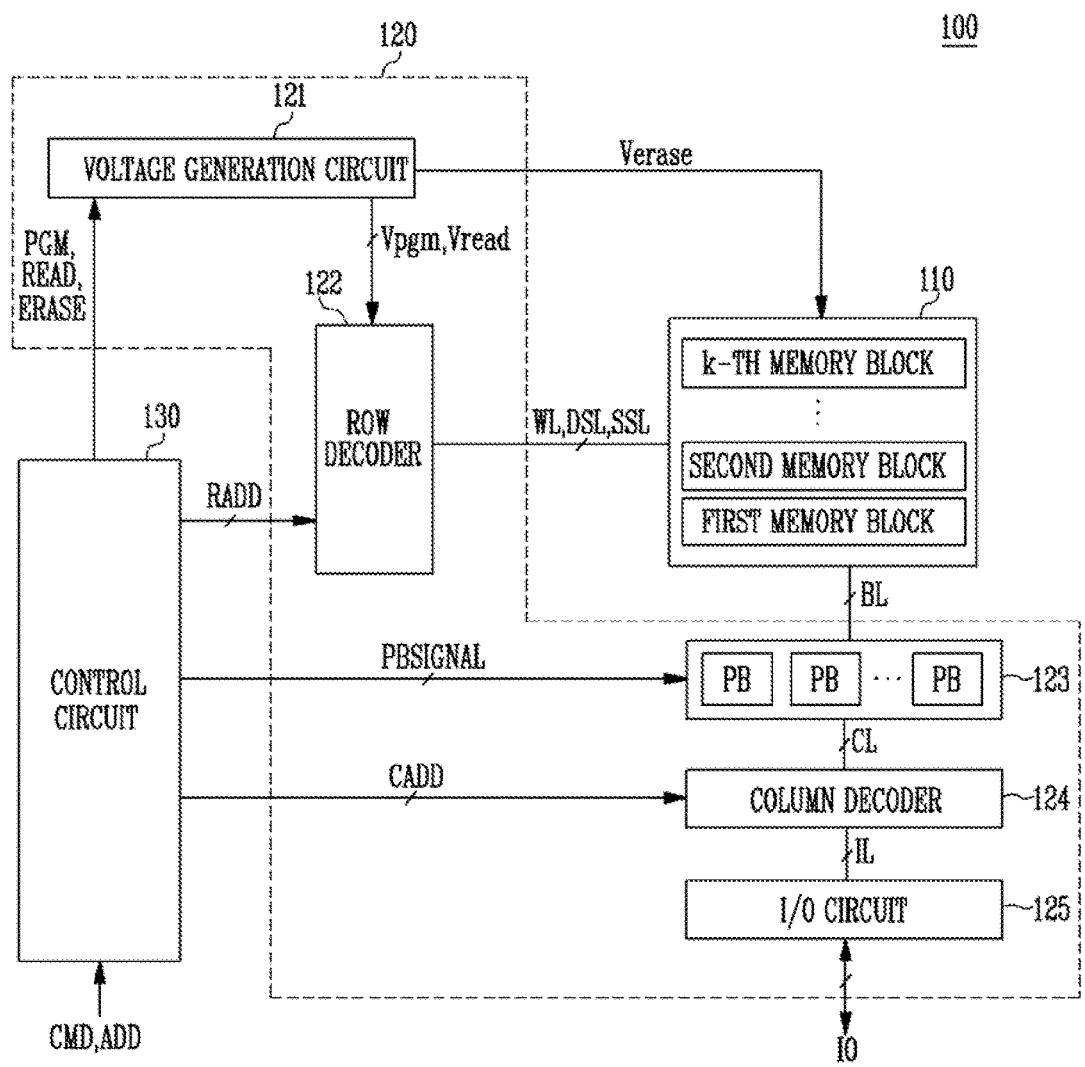
FIG. 1 is a block diagram illustrating a 3D semiconductor device according to an exemplary embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. Throughout the disclosure reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a 3D semiconductor device 100 according to an embodiment of the present invention.

Referring to FIG. 1, the semiconductor device 100 may include a memory cell array 110, a peripheral circuit 120, and a control circuit 130.

The memory cell array 110 includes first to k-th memory blocks. The first to k-th memory blocks each have a 3D structure. For example, each of the first to k-th memory blocks includes a plurality of memory cells drain selection transistors, and source selection transistors stacked in a direction substantially perpendicular to a semiconductor substrate.

The peripheral circuit 120 performs a program operation, a read operation, and an erase operation on the memory cells, the drain selection transistors, and the source selection transistors included in the memory cell array 110 under the control of the control circuit 130.

The peripheral circuit 120 may include a voltage generation circuit 121, a row decoder 122, a page buffer group 123, a column decoder 124, and an input/output (I/O) circuit 125.

The voltage generation circuit 121 generates a program voltage Vpgm, a read voltage Vread, an erase voltage Verase, and a verify voltage in response to a program signal PGM, a read signal READ, and an erase signal ERASE. For example, the voltage generation circuit 121 generates the program voltage Vpgm and read voltage Vread to supply them to the row decoder 122, and generates the erase voltage Verase to supply it to the memory cell array 110. Although not shown, the voltage generation circuit 121 generates pass voltages with various levels needed for the program, read, and erase operations in addition to the program voltage Vpgm, the read voltage Vread, and the erase voltage Verase.

The row decoder 122 selects one of the first to k-th memory blocks based on a row address RADD, and transfers voltages generated in the voltage generation circuit 121 to word lines WL, drain selection lines DSL, and source selection lines SSL connected to the selected memory block.

The page buffer group 123 includes a plurality of page buffers PB configured to temporarily store data in response to page buffer control signal PBSIGNAL. The plurality of page buffers PB are connected to the memory cell array 110 through bit lines BL, and transfer the temporarily stored data to the bit lines BL or temporarily store the data transferred through the bit lines BL from the memory cell array 110 in response to the page buffer control signal PBSIGNAL.

The column decoder 124 is connected to the plurality of page buffers PB through column lines CL, and transfers data to the plurality of page buffers PB or receives data from the plurality of page buffers PB based on a column address CADD.

The I/O circuit 125 is connected to the column decoder 124 through I/O lines IL, and transfers I/O data IO to the column decoder 124 or outputs data transferred from the column decoder 124 to the outside.

The control circuit 130 outputs the program signal PGM, the read signal READ, the erase signal ERASE, the row address RADD, the page buffer control signal PBSIGNAL, and the column address CADD based on a command CMD and an address ADD, which are input from the outside, to control the peripheral circuits 120.

Figure 2:
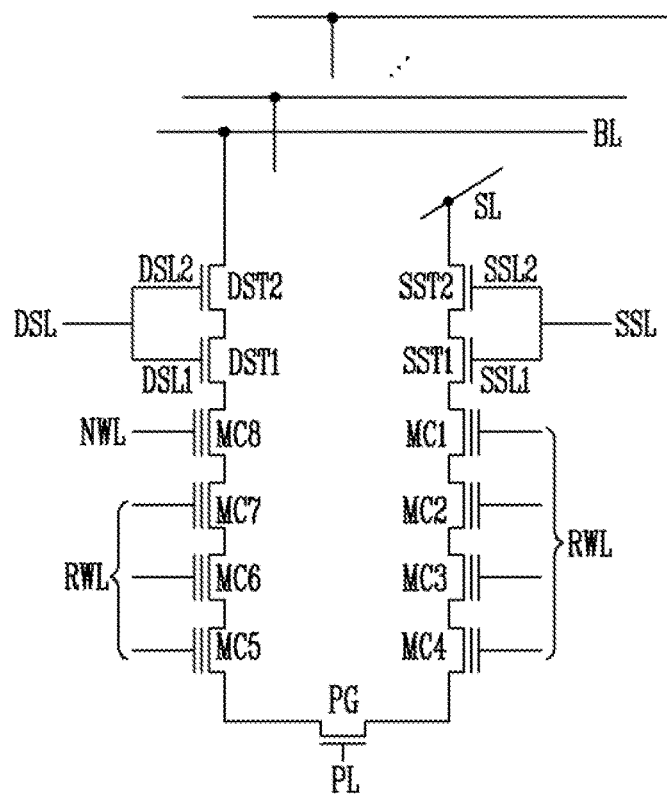
FIG. 2 is a detailed diagram illustrating an example of a memory block shown in FIG. 1.

FIG. 2 is a detailed diagram illustrating an example of the memory block shown in FIG. 1.

Referring to FIG. 2, the memory block includes a plurality of cell strings each with the shape of the letter U. The upper portion of one end of the respective cell strings is connected to the corresponding bit line BL, the upper portion of the another end of the respective cell strings is connected to a common source line SL, and the lower portion of the respective cell strings is connected to a pipe gate PG.

Each of the cell strings includes memory cells MC1 to MC4, a first source selection transistor SST1, and a second source selection transistor SST2, which are connected between the common source line SL and the pipe gate PG, and memory cells MC5 to MC8, a first drain selection transistor DST1, and a second drain selection transistor DST2, which are connected between the corresponding bit line BL and the pipe gate PG.

Gates of the memory cells MC1 to MC8 are connected to the respective word lines NWL and RWL, a gate of the first drain selection transistor DST1 is connected to a first drain selection line DSL1, a gate of the second drain selection transistor DST2 is connected to a second drain selection line DSL2, a gate of the first source selection transistor SST1 is connected to a first source selection lines SSL1, a gate of the second source selection transistor SST2 is connected to a second source selection line SSL2, and a gate of the pipe gate PG is connected to a pipe line PL. In an embodiment of the present invention, for convenience of explanation, hereinafter, a word line adjacent to the first drain selection line DSL1 is denoted by "NWL" and is called "neighboring word line", and the rest of word lines are denoted by "RWL" and are called "rest word line". Further, the first and second drain selection line DSL1 and DSL2 are commonly connected to a drain selection line DSL, and the first and second source selection lines SSL1 and SSL2 are commonly connected to a source selection line SSL.

Figure 3:
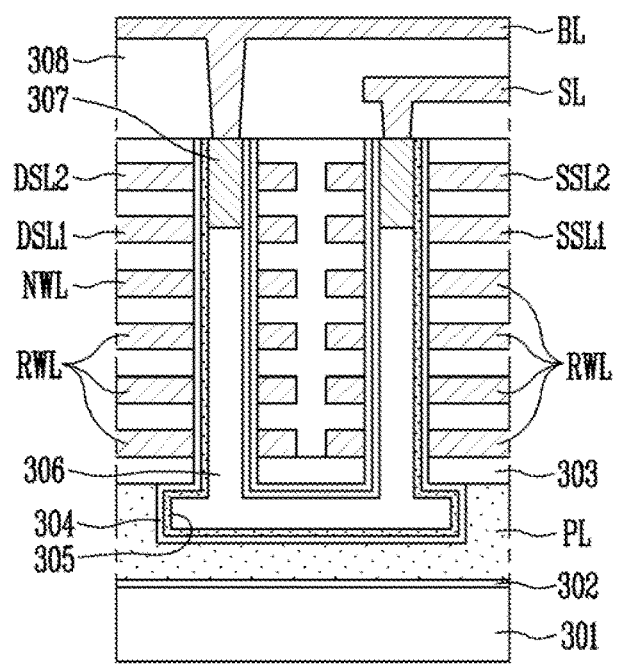
FIG. 3 is a cross-sectional view illustrating a cell string shown in FIG. 2.

FIG. 3 is a cross-sectional view illustrating the cell string shown in FIG. 2.

Referring to FIG. 3, the cell string with the shape of the letter described with reference to FIG. 2 is formed in a direction substantially perpendicular to a semiconductor substrate 301. More specifically, a pipe insulating layer 302 is formed on the semiconductor substrate 301, and the pipe line PL is formed on the pipe insulating layer 302. A plurality of insulating layers 303, the word lines RWL and NWL, the first drain selection line DSL1, the first source selection line SSL1, the second drain selection line DSL2 and the second source selection line SSL2 are stacked on the upper portion of the pipe line PL. A vertical hole is formed to expose the pipe line PL by penetrating the insulating layers 303, the word lines RWL and NWL, the first drain selection line DSL1, the first source selection line SSL1, the second drain selection line DSL2, and the second source selection line SSL2. Further, a pipe trench is formed to connect vertical holes to each other inside the pipe line PL. A memory film 304, a channel film 305, and a channel insulating film 306 are formed along the inner surfaces of the vertical holes and the pipe trench. The memory film 304 may include a tunnel insulating film, a charge trap film, and a blocking film. A conductive film 307 instead of the channel insulating film 306 may be formed on a portion of the upper end of the vertical channel holes to improve a switching operation of the drain and source selection transistors. Since the cell string has a structure with the shape of the letter 'U', the conductive film 307 is formed on both upper ends of the cell string. The bit line BL is formed on the conductive film 307 formed on one upper end of the cell string, and the common source line SL is formed on the conductive film 307 formed on the other upper end of the cell string. An interlayer insulating film 308 is formed between the bit line BL and the common source line SL.

Figure 4:
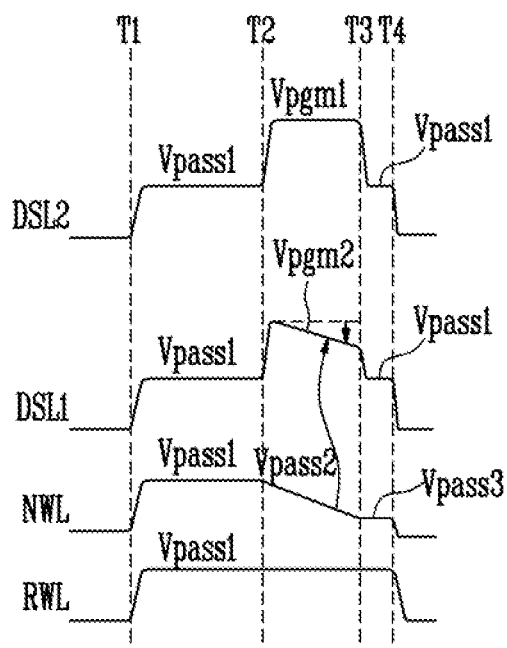
FIG. 4 is a timing diagram for describing a program operation of a 3D semiconductor device according to an exemplary embodiment of the present invention.

FIG. 4 is a timing diagram for describing a program operation of the 3D semiconductor device according to the embodiment of the present invention.

Referring to FIGS. 2 to 4, in the 3D semiconductor device, the first and second drain selection transistors DST1 and DST2 should be programmed to have threshold voltages increased by a certain level, in order to use the first and second drain selection transistors DST1 and DST2 as switching elements. For example, leakage currents of the first and second drain selection transistors DST1 and DST2 may be reduced by programming the first drain selection transistor DST1 to have a lower threshold voltage than the second drain selection transistor DST2. A method of programming the first and second drain selection transistors DST1 and DST2 will be explained in more detail below.

Pass Voltage Applying Period (T1~T2)

When a program operation is started, a program allowance voltage or a program prohibition voltage is applied to the bit lines BL, a first pass voltage Vpass1 is applied to the word lines NWL and RWL and the first and second drain selection lines DSL1 and DSL2. For example, the program allowance voltage may be a ground voltage, and the program prohibition voltage may be a power supply voltage. The first pass voltage Vpass1 may be a voltage capable of forming a channel inside the cell string.

Program Period (T2~T3)

After forming the channel inside the cell string, a first program voltage Vpgm1 is applied to the first and second drain selection lines DSL1 and DSL2, and the first and second drain selection transistors are programmed to increase threshold voltages of the first and second drain selection transistors. At this time, a voltage applied to the neighboring word line NWL adjacent to the first drain selection line DSL1 is decreased from the first pass voltage Vpass1 to a second pass voltage Vpass2, and a voltage applied to the rest of word lines RWL is maintained by the first pass voltage Vpass1.

As the voltage applied to the neighboring word line NWL adjacent to the first drain selection line DSL1 is decreased from the first pass voltage Vpass1 to the second pass voltage Vpass2, a voltage applied to the first drain selection line DSL1 is decreased from the first program voltage Vpgm1 to a second program voltage Vpgm2 due to coupling effect. That is, since the first and second drain selection lines DSL1 and DSL2 are commonly connected to the drain selection line DSL, when the first program voltage Vpgm1 is applied to the drain selection line DSL, the first program voltage Vpgm1 is also commonly applied to the first and second drain selection lines DSL1 and DSL2. However, the voltage of the first drain selection line DSL1 is decreased from the first program voltage Vpgm1 to the second program voltage Vpgm2 due to the second pass voltage Vpass2 applied to the neighboring word line NWL. A method of lowering the first pass voltage Vpass1 applied to the neighboring word line NWL may be implemented diversely. For example, there is a method of continuously or gradationally (i.e., in stages) decreasing from the first pass voltage Vpass1 to a target voltage, or a method of directly decreasing from the first pass voltage Vpass1 to the target voltage at the time point of T2. When lowering the voltage applied to the neighboring word line NWL, the voltage applied to the first drain selection line DSL1 is also decreased due to the coupling effect. For this reason, the first drain selection transistor DST1 is programmed more slowly than the second drain selection transistor DST2, and thus a time for programming the second drain selection transistor may be fully secured. That is, since the second drain selection transistor DST2 is fully programmed, a stable threshold voltage needed for a switching operation may be obtained, and thus a leakage current of the second drain selection transistor DST2 may be reduced.

Program Completion Period (T3~T4)

After programming the first and second drain selection transistors DST1 and DST2 for a certain time (T2 T3), the first pass voltage Vpass1 is applied to the first and second drain selection lines DSL1 to DSL2. At this time, a third pass voltage Vpass3, which has a lower level than the first pass voltage Vpass1 and a higher level than a ground voltage is applied to the neighboring word line NWL, and the rest word lines RWL is maintained by the first pass voltage Vpass1. When the program completion period is ended, the first and second drain selection lines DSL1 and DSL2, and the word lines NWL and RWL are discharged for the next operation.

In addition to the above-described method, in order to have the first drain selection transistor DST1 with a much lower threshold voltage than the second drain selection transistor DST2, the first and second drain selection lines DSL1 and DSL2 may be formed to have different resistances or work functions.

Figure 5A:
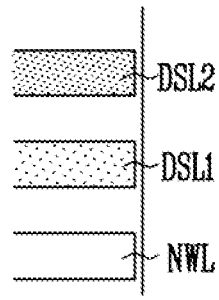
FIGS. 5A to 5C are cross-sectional views for describing a method of manufacturing a 3D semiconductor device according to an exemplary embodiment of the present invention.
Figure 5B:
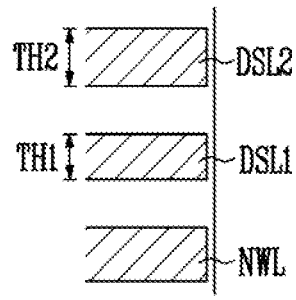
Figure 5C:
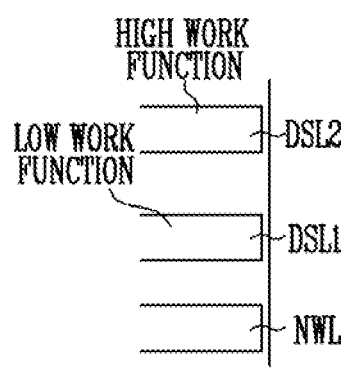

FIGS. 5A to 5C are cross-sectional views for describing a method of manufacturing the 3D semiconductor device according to an exemplary embodiment of the present invention.

Referring to FIG. 5A, in order to form the first drain selection line DSL1 with a higher resistance than the second drain selection line DSL2, the first drain selection line DSL1 may be formed to have a lower impurity concentration than the second drain selection line DSL2. For example, the first and second drain selection lines DSL1 and DSL2 may be formed as a polysilicon doped with an impurity, and the impurity doped in the polysilicon has a function to allow the polysilicon to have a higher conductivity. The higher the impurity concentration of the doped polysilicon is, the more the conductivity has. The first drain selection line DSL1 has a higher resistance than the second drain selection line DSL2, when the first drain selection line DSL1 has a lower impurity concentration than the second drain selection line DSL2. Accordingly, even when the same program voltage is applied to the first and second drain selection lines DSL1 and DSL2, the first drain selection transistor DST1 has a lower program voltage than the second drain selection transistor DST2. The threshold voltage of the first drain selection transistor DST1 reach to a target level more slowly than that of the second drain selection transistor DST2, and thus the second drain selection transistor DST2 may be fully programmed.

Referring to FIG. 5B, in order to form the first drain selection line DSL1 with a higher resistance than the second drain selection line DSL2 the first drain selection line DSL1 may be formed to have a smaller thickness TH1 than a thickness TH2 of the second drain selection line DSL2 (TH1<TH2).

Referring to FIG. 5C, in order to form a second drain selection transistor DST2 with a higher threshold voltage than a first drain selection transistor DST1, the second drain selection line DSL2 may be formed as a material with a higher work function than the first drain selection line DSL1. Since a work function of a polysilicon is proportional to a P-type impurity concentration, the second drain selection line DSL2 may be formed by using a polysilicon with a higher P-type impurity concentration than the first drain selection line DSL1.

Figure 6:
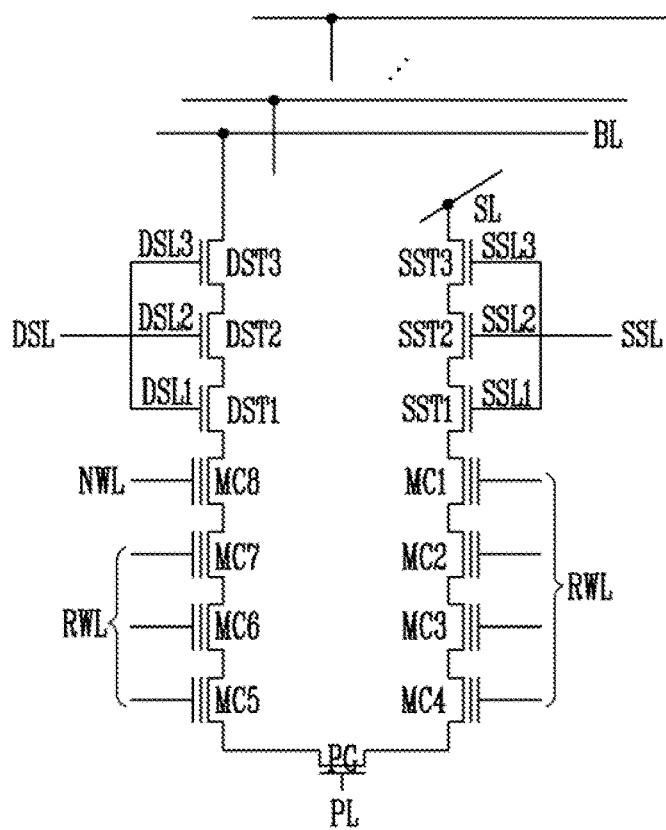
FIG. 6 is a detailed diagram illustrating another example of a memory block shown in FIG. 1.

FIG. 6 is a detailed diagram illustrating another example of the memory block shown in FIG. 1.

Referring to FIG. 6, the memory block includes a plurality of cell strings each with the shape of the letter 'U'. The upper portion of one end of the respective cell is connected to the corresponding bit line BL, the upper portion of another end of the respective cell strings is connected to a common source line SL, and the lower portion of the respective cell strings is connected to a pipe gate PG. Each of the cell strings includes memory cells MC1 to MC4, a first source selection transistor SST1, a second source selection transistor SST2, and a third source selection transistor SST3, which are connected between the common source line SL and the pipe gate PG, and memory cells MC5 to MC8, a first drain selection transistor DST1, a second drain selection transistor DST2, and a third drain selection transistor DST3, which are connected between the corresponding bit line BL and the pipe gate PG. That is, each of the plurality of cell strings includes the memory cells MC1 to MC8, the first drain selection transistor DST1, the second drain selection transistor DST2, the third drain selection transistor DST3, the first source selection transistor SST1, the second source selection transistor SST2, and the third source selection transistor SST3.

Gates of the plurality of memory cells MC1 to MC8 are connected to the respective word lines NWL and RWL, a gate of the first drain selection transistor DST1 is connected to a first drain selection line DSL1, a gate of the second drain selection transistor DST2 is connected to a second drain selection line DSL2, a gate of the third drain selection transistor DST3 is connected to a third drain selection lines DSL3, a gate of the first source selection transistor SST1 is connected to a first source selection line SSL1, a gate of the second source selection transistor SST2 is connected to a second source selection line SSL2, a gate of the third source selection transistor SST3 is connected to a third source selection line SSL3, and a gate of the pipe gate PG is connected to a pipe line PL. Further, the first to third drain selection line DSL1 to DSL3 are commonly connected to a drain selection line DSL, and the first to third source selection lines SSL1 to SSL3 are commonly connected to a source selection line SSL.

Figure 7:
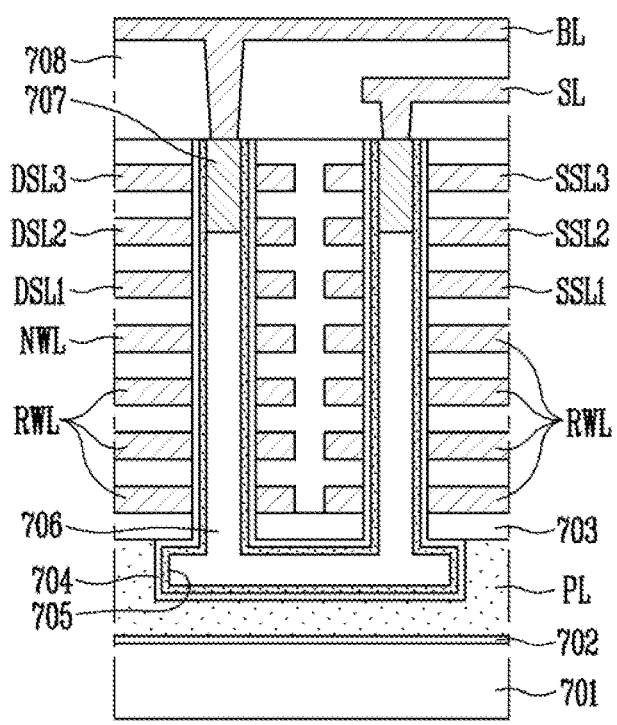
FIG. 7 is a cross-sectional' view illustrating a cell string shown in FIG. 6.

FIG. 7 is a cross-sectional view of the cell string shown in FIG. 6.

Referring to FIG. 7, the plurality of cell string with the shape of the letter 'U' described with reference to FIG. 6 are formed in a direction substantially perpendicular to a semiconductor substrate 701. More specifically, a pipe insulating film 702 is formed on the semiconductor substrate 701, the pipe line PL is formed on the pipe insulating film 702. A plurality of insulating films 703, the word lines RWL and NWL, the first drain selection line DSL1, the first source selection line SSL1, the second drain selection line DSL2, the second source selection line SSL2, the third drain selection line DSL3, and the third source selection line SSL3 are stacked on the upper portion of the pipe line PL. Vertical holes are formed to expose the pipe line PL by penetrating the insulating films 703, the word lines RWL and NWL, the first drain selection line DSL1, the first source selection line SSL1, the second drain selection line DSL2, the second source selection line SSL2, the third drain selection line DSL3, and the third source selection line SSL3. Further, a pipe trench is formed to connect the vertical holes to each other inside the pipe line PL. A memory film 704, a channel film 705, and a channel insulating film 706 are formed along the inner surfaces of the vertical holes and the pipe trench. The memory layer film 704 may include a tunnel insulating film, a charge trap film, and a blocking film. A conductive film 707 instead of the channel insulating film 706 may be formed on a portion of the upper end of the vertical channel holes to improve a switching operation of the drain and source selection transistors. Since the cell string has a structure with the shape of the letter 'U', the conductive film 707 is formed on both upper ends of the cell string. The bit line BL is formed on the conductive film 707 formed on one upper end of the cell string, and the common source line SL is formed on the conductive film 707 formed on the other upper end of the cell string. An interlayer insulating film 708 is formed between the bit line BL and the common source line SL.

Figure 8:
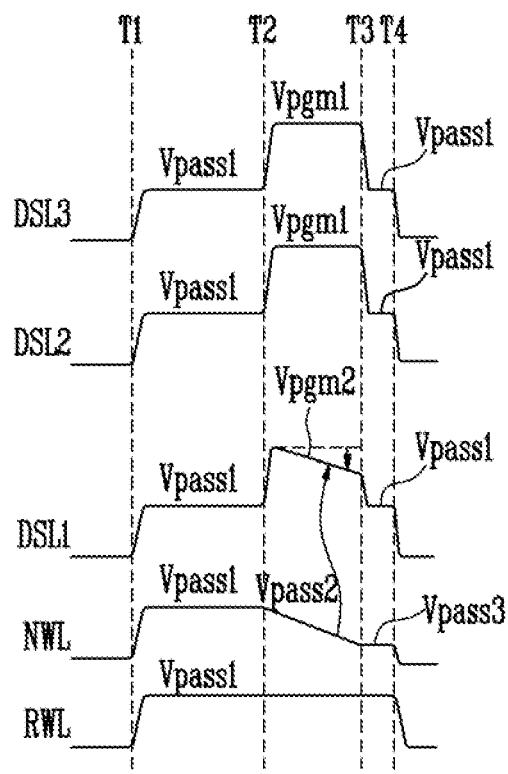
FIG. 8 is a timing diagram for describing a program operation of a 3D semiconductor device according to an embodiment of the present invention.

FIG. 8 is a timing diagram for describing a program operation of the 3D semiconductor device according to the exemplary embodiment of the present invention.

Referring to FIGS. 6 to 8, in order to use the first to third drain selection transistors DST1 to DST3 as switching elements in the 3D semiconductor device, threshold voltages of the first to third drain selection transistors DST1 to DST3 should be programmed to increase by a certain level. For example, leakage currents of the first to third drain selection transistors DST1 to DST3 may be reduced by programming the first drain selection transistor DST1 to have a lower threshold voltage level than the second and third drain selection transistors DST2 and DST3. A method of programming the first to third drain selection transistors DST1 to DST3 will be explained in detail below.

Pass Voltage Applying Period (T1~T2)

When a program operation is started, a program allowance voltage or a program prohibition voltage is applied to the bit lines BL, a first pass voltage Vpass1 is applied to the word lines NWL and RWL, and the first to third drain selection lines DSL1 to DSL3. For example, the program allowance voltage may be a ground voltage, and the program prohibition voltage may be a power supply voltage. The first pass voltage Vpass1 may be a voltage capable of forming a channel inside the cell string.

Program Period (T2~T3)

After forming the channel inside the cell string, a first program voltage Vpgm1 is applied to the first to third drain selection lines DSL1 to DSL3, and the first to third drain selection transistors are programmed to increase threshold voltages of the first to third drain selection transistors. At this time, a voltage applied to the neighboring word line NWL adjacent to the first drain selection line DSL1 is decreased from the first pass voltage Vpass1 to a second pass voltage Vpass2, and a voltage applied to the rest word lines RWL is maintained by the first pass voltage Vpass1.

As the voltage applied to the neighboring word line NWL adjacent to the first drain selection line DSL1 is decreased from the first pass voltage Vpass1 to the second pass voltage Vpass2, a voltage applied to the first drain selection line DSL1 is decreased from the first program voltage Vpgm1 to a second program voltage Vpgm2 due to coupling effect. That is, even when the first program voltage Vpgm1 is commonly applied to the first to third drain selection lines DSL1 to DSL3, the voltage applied to the first drain selection line DSL1 is decreased to the second program voltage Vpgm2 due to the second pass voltage Vpass2 applied to the neighboring word line NWL. A method of lowering the first pass voltage Vpass1 applied to the neighboring word line NWL may be implemented diversely. For example, there is a method of continuously or gradationally (i.e., in stages) decreasing from the first pass voltage Vpass1 to a target voltage, or a method of directly decreasing to the target voltage at the time point of T2. When lowering the voltage applied to the neighboring word line NWL, the voltage applied to the first drain selection line DSL1 is decreased due to the coupling effect. For this reason, the first drain selection transistor DST1 is programmed more slowly than the second and third drain selection transistors DST2 and DST3, and thus a time for programming the second and third drain selection transistors may be fully secured. That is, since the second and third drain selection transistors DST3 are fully programmed, a stable threshold voltage needed for a switching operation may be obtained, and then leakage currents of the second and third drain selection transistors DST2 and DST3 may be reduced.

Program Completion Period (T3~T4)

After programming the first to third drain selection transistors DST1 to DST3 for a certain time (T2 T3), the first pass voltage Vpass1 is applied to the first to third drain selection lines DSL1 to DSL3. At this time, a third pass voltage Vpass3, which has a lower level than the first pass voltage Vpass1 and a higher level than a ground voltage, is applied to the neighboring word line NWL, and the rest word lines RWL is maintained by the first pass voltage Vpass1. When the program completion period is ended, the first to third drain selection lines DSL1 to DSL3, and the word lines NWL and RWL are discharged for the next operation.

In addition to the above-described method, in order to form the first drain selection transistor DST1 with a lower threshold voltage than the second and third drain selection transistors DST2 and DST3, when manufacturing a semiconductor device, the first to third selection lines DSL1 to DSL3 may be formed to have different resistances or work functions.

Figure 9A:
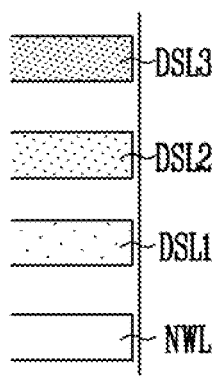
FIGS. 9A to 9C are cross-sectional views for describing a method of manufacturing a 3D semiconductor device according to an exemplary embodiment of the present invention.
Figure 9B:
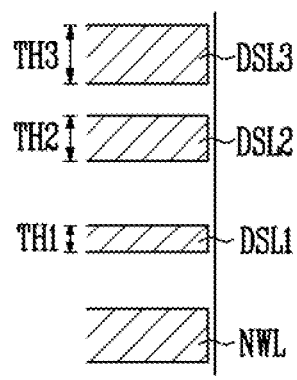
Figure 9C:
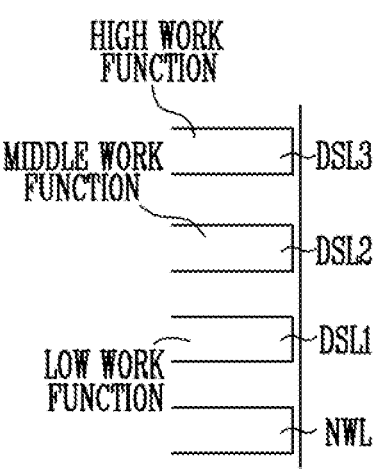

FIGS. 9A to 9C are cross-sectional views for describing a method of manufacturing the 3D semiconductor device according to an exemplary embodiment of the present invention.

Referring to FIG. 9A, in order to form the first drain selection line DSL1 with a higher resistance than the second drain selection line DSL2, the first drain selection line DSL1 may be formed to have a lower impurity concentration than the second drain selection line DSL2. Further, the second drain selection line DSL2 may be formed as a material with a higher resistance than the third drain selection line DSL3. For example, the first to third drain selection lines DSL1 to DSL3 may be formed as a polysilicon doped with an impurity, and the impurity doped in the polysilicon has a function to allow the polysilicon to have a higher conductivity. The higher the impurity concentration of the doped polysilicon is, the more the higher conductivity has. The first drain selection line DSL1 has a higher resistance than the second and third drain selection lines DSL2 and DSL3, when the first drain selection line DSL1 has a lower impurity concentration than the second and third drain selection lines DSL2 and DSL3. Accordingly, even when the same program voltage is applied to the first to third drain selection lines DSL1 to DSL3, the first drain selection transistor DSL1 has a lower program voltage than the second and third drain selection transistors DSL2 and DSL3. The threshold voltage of the first drain selection transistor DSL1 reach to the target level more slowly than those of the second and third drain selection transistors DSL2 and DSL3, and thus the second and third drain selection transistors DSL2 and DSL3 may be fully programmed.

Referring to FIG. 9b, in order to form the first drain selection line DSL1 with a higher resistance than the second and third drain selection lines DSL2 and DSL3, the first drain selection line DSL1 may be formed to have a smaller thickness TH1 than thicknesses TH2 and TH3 of the second and third drain selection lines DSL2 and DSL3. Further, resistances of the second and third drain selection lines DSL2 and DSL3 may be formed differently using a thickness difference of the second and third drain selection lines DSL2 and DSL3. For example, the second drain selection line DSL2 may be formed to have a smaller thickness TH2 than a thickness TH3 of the third drain selection line DSL3 (TH1<TH2<TH3). In this case, the third drain selection transistor DST3 may be programmed more than the second drain selection transistor DST2, and the second drain selection transistor DST2 may be programmed more than the first drain selection transistor DST1.

Referring to FIG. 9C, in order to form the first drain selection line DSL1 with a higher resistance than the second and third drain selection lines DSL2 and DSL3, the first drain selection line DSL1 may be formed as a material with a lower work function than the second and third drain selection lines DSL2 and DSL3. Since a work function of a polysilicon is proportional to a P-type impurity concentration, the first drain selection line DSL1 may be formed by using a polysilicon with a lower P-type impurity concentration than the second and third drain selection lines DSL2 and DSL3 to form the first to third drain selection lines DSL1 to DSL1. Further, the second and third drain selection lines DSL2 and DSL3 may be formed to have work functions different from each other. For example, the second drain selection line DSL2 may be formed to have a lower work function than the third drain selection line DSL3. In this case, the third drain selection transistor DST3 may be programmed more than the second drain selection transistor DST2, and the second drain selection transistor DST2 may be programmed more than the first drain selection transistor DST1.

In addition to the above-described method, interlayer insulating films formed between the first to third drain selection lines DSL1 to DSL3 may be formed as a material with a dielectric constant different from one another. For example, an interlayer insulating film formed between the first and second drain selection lines DSL1 and DSL2 may have a lower dielectric layer than an interlayer insulating film formed between the second and third drain selection lines DSL2 and DSL3. For this, when manufacturing a semiconductor device, a low dielectric (low-k) material may be formed between the first and second drain selection lines DSL1 and DSL2, and a high dielectric (high-k) material may be formed between the second and third drain selection lines DSL2 and DSL3.

The above-described embodiments may be implemented separately or in combination. In addition, in the above-described embodiments, a program method of drain selection transistors have been explained, but the method may also be applied to source selection transistors. Further, the method may be applied to a 3D semiconductor device having a vertical channel layer and including a plurality of selection transistors.

According to the embodiments of the present invention, reliability of a semiconductor device may be improved by reducing a leakage current of a cell string.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a semiconductor device, the method comprising;
    forming a vertical channel layer on a semiconductor substrate;
    forming word lines spaced apart from each other along the vertical channel layer;
    forming a first select line over the word lines after forming the word lines, wherein the first select line has a first resistance and a first thickness;
    forming a second select line over the first select line, wherein the second select line has a second resistance less than the first resistance, and a second thickness greater than the first thickness.

2. A method of manufacturing a semiconductor device, the method comprising;
    forming a vertical channel layer on a semiconductor substrate;
    forming word lines spaced apart from each other along the vertical channel layer;
    forming a first select line over the word lines after forming the word lines, wherein the first select line has a first concentration of a P-type impurity; and
    forming a second select line over the first select line, wherein the second select line has a second concentration of the P-type impurity greater than the first concentration of the P-type impurity.

3. The method of claim 2, wherein
the second select line has a work function that is lower than a work function of the first select line.

4. The method of claim 1, further comprises:
    forming a third select line over the second select line, wherein the third select line has a third resistance less than the second resistance, and a third thickness greater than the second thickness.

5. The method of claim 4, wherein a distance between the first select line and the second select line is greater than a distance between the second select line and the third select line.

6. The method of claim 2, further comprises:
    forming a third select line over the second select line, wherein the third select line has a third concentration of the P-type impurity greater than the second concentration of the P-type impurity.

7. The method of claim 6, wherein a distance between the first select line and the second select line is greater than a distance between the second select line and the third select line.

* * * * *